(12) United States Patent
Rao

(10) Patent No.: US 11,316,014 B2
(45) Date of Patent: *Apr. 26, 2022

(54) SEMICONDUCTOR DEVICES WITH GRADED DOPANT REGIONS

(71) Applicant: GREENTHREAD, LLC, Dallas, TX (US)

(72) Inventor: G. R. Mohan Rao, Allen, TX (US)

(73) Assignee: GREENTHREAD, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/371,839

(22) Filed: Jul. 9, 2021

(65) Prior Publication Data

US 2021/0359086 A1     Nov. 18, 2021

Related U.S. Application Data

(60) Continuation of application No. 16/947,294, filed on Jul. 27, 2020, now Pat. No. 11,121,222, which is a
(Continued)

(51) Int. Cl.
*H01L 29/10*     (2006.01)
*H01L 27/11524*  (2017.01)
(Continued)

(52) U.S. Cl.
CPC .... *H01L 29/1095* (2013.01); *H01L 27/11521* (2013.01); *H01L 27/11524* (2013.01);
(Continued)

(58) Field of Classification Search
CPC .................................................. H01L 29/1095
(Continued)

(56) References Cited

U.S. PATENT DOCUMENTS

| 4,160,985 A | 7/1979 | Kamins et al. |
| 4,684,971 A | 8/1987 | Payne |

(Continued)

FOREIGN PATENT DOCUMENTS

| JP | s6482563 A | 3/1989 |
| JP | 2003051551 A | 2/2003 |

(Continued)

OTHER PUBLICATIONS

IPR2020-00288—Exhibit 1029—Claim Construction District Court Apr. 20, 2020.

(Continued)

*Primary Examiner* — Ajay Arora
(74) *Attorney, Agent, or Firm* — Gregory M. Howison

(57) ABSTRACT

Most semiconductor devices manufactured today, have uniform dopant concentration, either in the lateral or vertical device active (and isolation) regions. By grading the dopant concentration, the performance in various semiconductor devices can be significantly improved. Performance improvements can be obtained in application specific areas like increase in frequency of operation for digital logic, various power MOSFET and IGBT ICs, improvement in refresh time for DRAMs, decrease in programming time for nonvolatile memory, better visual quality including pixel resolution and color sensitivity for imaging ICs, better sensitivity for varactors in tunable filters, higher drive capabilities for iFETs, and a host of other applications.

30 Claims, 10 Drawing Sheets

Related U.S. Application Data continuation of application No. 16/717,950, filed on Dec. 17, 2019, now Pat. No. 10,734,481, which is a continuation of application No. 15/590,282, filed on May 9, 2017, now Pat. No. 10,510,842, which is a continuation of application No. 14/931,636, filed on Nov. 3, 2015, now Pat. No. 9,647,070, which is a continuation of application No. 14/515,584, filed on Oct. 16, 2014, now Pat. No. 9,190,502, which is a continuation of application No. 13/854,319, filed on Apr. 1, 2013, now abandoned, which is a continuation of application No. 11/622,496, filed on Jan. 12, 2007, now Pat. No. 8,421,195, which is a division of application No. 10/934,915, filed on Sep. 3, 2004, now abandoned.

(51) Int. Cl.
| | |
|---|---|
| H01L 27/146 | (2006.01) |
| H01L 27/11521 | (2017.01) |
| H01L 29/739 | (2006.01) |
| H01L 29/36 | (2006.01) |
| H01L 27/02 | (2006.01) |
| H01L 27/108 | (2006.01) |

(52) U.S. Cl.
CPC ........ *H01L 27/14643* (2013.01); *H01L 29/36* (2013.01); *H01L 29/7395* (2013.01); *H01L 27/0214* (2013.01); *H01L 27/10844* (2013.01)

(58) Field of Classification Search
USPC .......................................................... 257/25
See application file for complete search history.

(56) References Cited

U.S. PATENT DOCUMENTS

| | | | |
|---|---|---|---|
| 4,688,063 A | 8/1987 | Lu et al. | |
| 4,907,058 A | 3/1990 | Sakai | |
| 4,994,887 A | 2/1991 | Hutter et al. | |
| 5,835,402 A | 11/1998 | Rao et al. | |
| 6,025,237 A | 2/2000 | Choi | |
| 6,384,431 B1 | 5/2002 | Takahashi et al. | |
| 6,465,862 B1 | 10/2002 | Harris | |
| 2001/0028097 A1 | 10/2001 | Matsuoka et al. | |
| 2002/0195656 A1 | 12/2002 | Hattori | |
| 2003/0183856 A1 | 10/2003 | Wieczorek et al. | |
| 2007/0045682 A1* | 3/2007 | Hong ............... | H01L 27/14689 257/292 |
| 2008/0142899 A1 | 6/2008 | Morris et al. | |
| 2014/0034997 A1* | 2/2014 | Rahimo ............... | H01L 29/861 257/139 |
| 2017/0243876 A1 | 8/2017 | Rao | |

FOREIGN PATENT DOCUMENTS

| | | |
|---|---|---|
| JP | 2003218356 A | 7/2003 |
| WO | 2004049453 A1 | 6/2004 |

OTHER PUBLICATIONS

IPR2020-00288—Exhibit 2007—Minutes for Markman Hearing Held via Video Conference Before U.S. District Judge Rodney Gilstrap, *Greenthread, LLC* v. *Samsung Electronics Co., Ltd., et al.*, Case No. 2:19-CV-147-JRG.
IPR2020-00288—Petitioner Reply.
IPR2020-00289-0289 Petitioner Reply.
IPR2020-00292—Petition for IPR.
IPR2020-00292—Exhibit 2002—Excerpt from Exhibit 4 to Appendix B of Samsung Electronics Co., Ltd.'s Invalidity Contentions (Invalidity Contention based on U.S. Pat. No. 6,384,431 to Takahashi.
IPR2020-00288—Ex. 1020—Michael Nastasi and James W. Mayer, Ion Implantation and Synthesis of Materials (2006). 4 pages.
IPR2020-00288—Exhibit 2001—IPR2020-00288—Excerpt from Exhibit 1 to Appendix A of Samsung Electronics Co., Ltd.'s Invalidity Contentions regarding Morris.
IPR2020-00288—Exhibit 2002—xcerpt from Exhibit 2 to Appendix A of Samsung Electronics Co., Ltd.'s Invalidity Contentions regarding Miyamoto.
IPR2020-00288—Exhibit 2009—Complaint for Patent Infringement, *Greenthread, LLC* v. *Samsung Electronics Co., Ltd., at al.*, Case No. 2:19-CV-147-JRG.
IPR2020-00288—Exhibit 2011—Exhibit A to Revised Joint Claim Construction Chart Pursuant to Patent Rule 4-5, *Greenthread, LLC* v. *Samsung Electronics Co., Ltd., et al.*, Case No. 2:19-CV-147-JRG.
IPR2020-00288—Exhibit 2012—Samsungs Responsive Claim Construction Brief—District Court.
IPR2020-00288—Exhibit 2013—Glew Dec.
IPR2020-00288—Exhibit 2014—Excerpt from Exhibit 10 to Appendix A of Samsung Electronics Co., Ltd.'s Invalidity Contentions.
IPR2020-00288—Patent Owner Preliminary Response.
IPR2020-00288—Patent Owner Sur Reply.
IPR2020-00288—Petition.
IPR2020-00289—Exhibit 1 to Appendix C of Samsung Electronics Co., Ltd.'s Invalidity Contentions regarding Payne.
IPR2020-00289—Exhibit 1003—Smith Dec.
IPR2020-00289—Exhibit 1010—S. M. Sze et al., Semiconductor Devices: Physics and Technology, John Wiley & Sons, 2nd Ed., 2002 ("Sze '02").
IPR2020-00289—Exhibit 1012—Ben G. Streetman, Solid State Electronic Devices, 2nd Ed., Prentice-Hall, 1980 ("Streetman").
IPR2020-00289—Exhibit 2001—Exhibit 1 to Appendix C of Samsung Electronics Co., Ltd.'s Invalidity Contentions regarding Payne.
IPR2020-00289—Exhibit 2002—Exhibit 3 to Appendix C of Samsung Electronics Co., Ltd.'s Invalidity Contentions regarding Wieczorek.
IPR2020-00289—Exhibit 2011—Behzad Razavi, Design of Analog CMOS Integrated Circuits, 2001 ("Razavi").
IPR2020-00289—Exhibit 2012—Excerpts from Wolf, S., Silicon Processing for the VLSI Era, vol. 4—Deep-Submicron Process Technology (2002) ("Wolf vol. 4").
IPR2020-00289—Exhibit 2013—Glew Dec.
IPR2020-00289—Patent Owner Pre Resp.
IPR2020-00289—Patent Owner Sur reply.
IPR2020-00289—Petition.
IPR2020-00290—Exhibit 1003—Declaration of Dr. Bruce Smith.
IPR2020-00290—Exhibit 1013—Tango, Mega bit Memory Technology.
IPR2020-00290—Patent Owner Preliminary Resp.
IPR2020-00290—Patent Owner Sur Reply.
IPR2020-00290—Petition.
IPR2020-00290—Petitioners Reply to Patent Owner Preliminary Response.
1PR2020-00291—Exhibit 1003—Declaration of Dr. Bruce Smith.
IPR2020-00291—Exhibit 1011—The Insulated Gate Bipolar Transistor: IGBT Theory and Design, Vinod Kumar Khanna, IEEE Press and Wiley-Interscience, 2003.
IPR2020-00291—Exhibit 1020—S. M. Sze, Physics of Semiconductor Devices, Wiley-Interscience, 2nd Ed., 1981 ("Sze '81").
IPR2020-00291—Exhibit 1021—S. M. Sze, Semiconductor Devices: Physics and Technology, John Wiley & Sons, 2nd Ed., 2002 ("Sze '02").
IPR2020-00291—Exhibit 2001—Exhibit 2 to Appendix B of Samsung Electronics Co., LTD'S Invalidity Contentions (Invalidity Contention based on U.S. Patent Application Publication No. 2002/0195656 ("Hattori")).
IPR2020-00291—Exhibit 2013—Declaration of Dr. Alexander D. Glew.
IPR2020-00291—Patent Owner Preliminary Resp.
IPR2020-00291—Patent Owner Sur Reply.
IPR2020-00291—Petition.
IPR2020-00291—Petitioners Reply.
IPR2020-00292—Exhibit 1003—Declaration of Dr. Bruce Smith.

(56) References Cited

OTHER PUBLICATIONS

IPR2020-00292—Exhibit 2001—Excerpt from Exhibit 1 to Appendix B of Samsung Electronics Co., Ltd.'s Invalidity Contentions (Invalidity Contention based on "Insulated Gate Bipolar Transistor IGBT Theory and Design" by Vinod Kumar Khanna.
IPR2020-00292—Exhibit 2012—Excerpt from Exhibit A to Joint Claim Construction Chart Pursuant to Patent Rule 4-5, *Greenthread, LLC* v. *Samsung Electronics Co., Ltd., et al.*, Case No. 2:19-CV-147-JRG, (Mar. 18, 2020).
IPR2020-00292—Patent Owner Preliminary Response.

* cited by examiner

SEMICONDUCTOR DEVICES WITH GRADED DOPANT REGIONS

CROSS-REFERENCE TO RELATED APPLICATIONS

This application is a Continuation of U.S. patent application Ser. No. 16/947,294, filed Jul. 27, 2020, entitled SEMICONDUCTOR DEVICES WITH GRADED DOPANT REGIONS, which is a Continuation of U.S. patent application Ser. No. 16/717,950, filed Dec. 17, 2019, entitled SEMICONDUCTOR DEVICES WITH GRADED DOPANT REGIONS, issued as U.S. Pat. No. 10,734,481 on Aug. 4, 2020. U.S. patent application Ser. No. 16/717,950 is a Continuation of U.S. patent application Ser. No. 15/590,282, filed May 9, 2017, entitled SEMICONDUCTOR DEVICES WITH GRADED DOPANT REGIONS, issued as U.S. Pat. No. 10,510,842 on Dec. 17, 2019, which is a Continuation of U.S. patent application Ser. No. 14/931,636, filed Nov. 3, 2015, entitled SEMICONDUCTOR DEVICES WITH GRADED DOPANT REGIONS, issued as U.S. Pat. No. 9,647,070 on May 9, 2017, which is Continuation of U.S. patent application Ser. No. 14/515,584, filed Oct. 16, 2014, entitled SEMICONDUCTOR DEVICES WITH GRADED DOPANT REGIONS, issued as U.S. Pat. No. 9,190,502 on Nov. 17, 2015, which is a Continuation of U.S. patent application Ser. No. 13/854,319 filed April 1, 2013, entitled SEMICONDUCTOR DEVICES WITH GRADED DOPANT REGIONS, which is a Continuation of Ser. No. 11/622,496, filed Jan. 12, 2007, entitled SEMICONDUCTOR DEVICES WITH GRADED DOPANT REGIONS, issued as U.S. Pat. No. 8,421,195 on Apr. 16, 2013, which is a Divisional of U.S. patent application Ser. No. 10/934,915, filed Sep. 3, 2004. The disclosures of which are incorporated herein by reference in their entirety.

TECHNICAL FIELD

This present invention relates to all semiconductor devices and systems. Particularly it applies to diffused diodes, avalanche diodes, Schottky devices, power MOS transistors, JFET's, RF bipolar transistors, IGBTs (Insulated Gate Bipolar Transistors), varactors, digital VLSI, mixed signal circuits and sensor devices including camera ICs employing CCD (Charge Coupled Device) as well as CMOS technologies.

BACKGROUND

Bipolar Junction Transistors (BJT) are classified as minority carrier devices because minority carriers are the principle device conduction mechanism. However, majority carriers also play a small but finite role in modulating the conductivity in BJTs. Consequently, both carriers (electrons and holes) play a role in the switching performance of BJTs. The maximum frequency of operation in BJTs is limited by the base transit time as well as the quick recombination of the majority carriers when the device is switched off (prior to beginning the next cycle). The dominant carrier mechanism in BJTs is carrier diffusion. The carrier drift current component is fairly small, especially in uniformly doped base BJTs. Efforts have been made in graded base transistors to create an aiding drift field to enhance the diffusing minority carrier's speed from emitter to collector. However, most semiconductor devices, including various power MOSFETs (traditional, DMOS, lateral, vertical and a host of other configurations), IGBT's (Insulated Gated Base Transistors), still use a uniformly doped 'drift epitaxial' region in the base. FIG. 1 shows the relative doping concentration versus distance in a BJT. FIG. 2 shows the uniformly doped epi region in an IGBT. In contrast to BJTs, MOS devices are majority carrier devices for conduction. The conduction is channel dominated. The channel can be a surface in one plane in planar devices. The surface can also be on the sidewalls in a vertical device. Other device architectures to combine planar and vertical conductions are also possible. The maximum frequency of operation is dictated primarily by source-drain separation distance. Most MOS devices use a uniformly doped substrate (or a well region). When a MOSFET is optimally integrated with a BJT in a monolithic fashion, an IGBT results. The IGBT inherits the advantages of both MOSFET and BJT. It also brings new challenges because the required characteristics (electron transit and hole recombination as fast as possible in n-channel IGBT) necessitate different dopant gradients either in the same layer at different positions, or at the interfaces of similar or dissimilar layers.

Retrograde wells have been attempted, with little success, to help improve soft error immunity in SRAMs and visual quality in imaging circuits. FIG. 3A shows a typical CMOS VLSI device employing a twin well substrate, on which active devices are subsequently fabricated. FIGS. 3B, 3C, and 3D illustrate device cross sections, as practiced today. Retrograde and halo wells have also been attempted to improve refresh time in DRAMs (dynamic random-access memories), as well as, reducing dark current (background noise) and enhance RGB (Red, Green, Blue) color resolution in digital camera ICs. Most of these techniques either divert the minority carriers away from the active regions of critical charge storage nodes at the surface, or, increase minority carrier density locally as the particular application requires.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A showing a typical prior art IC with two wells (one n⁻ well in which p-channel transistors are subsequently fabricated and one p⁻ well in which n-channel transistors are subsequently fabricated); FIG. 3B showing a prior art EEPROM (Electronically Erasable Programmable Read-Only Memory) memory cell having a tunnel insulator; FIG. 3C showing a prior art DRAM memory cell; and FIG. 3D showing a prior art NAND flash memory cell;

DETAILED DESCRIPTION

The relative doping concentrations of emitter and collector regions varies from $10^{18}$ to $10^{20}/cm^3$, whereas the base region is $10^{14}$ to $10^{16}$/cm³ depending on the desired characteristics of the BJT. In graded base p-n-p transistors, the donor dopant concentration may be 10 to 100× at the emitter-base junction, relative to the base-collector junction (1×). The gradient can be linear, quasi linear, exponential or complimentary error function. The relative slope of the donor concentration throughout the base creates a suitable aiding drift electric field, to help the holes (p-n-p transistor) transverse from emitter to collector. Since the aiding drift electric field helps hole conduction, the current gain at a given frequency is enhanced, relative to a uniformly-doped (base) BJT. The improvement in cut-off frequency (or, frequency at unity gain, $f_T$) can be as large as 2×-5×. Similar performance improvements are also applicable to n-p-n transistors.

Figure 1:
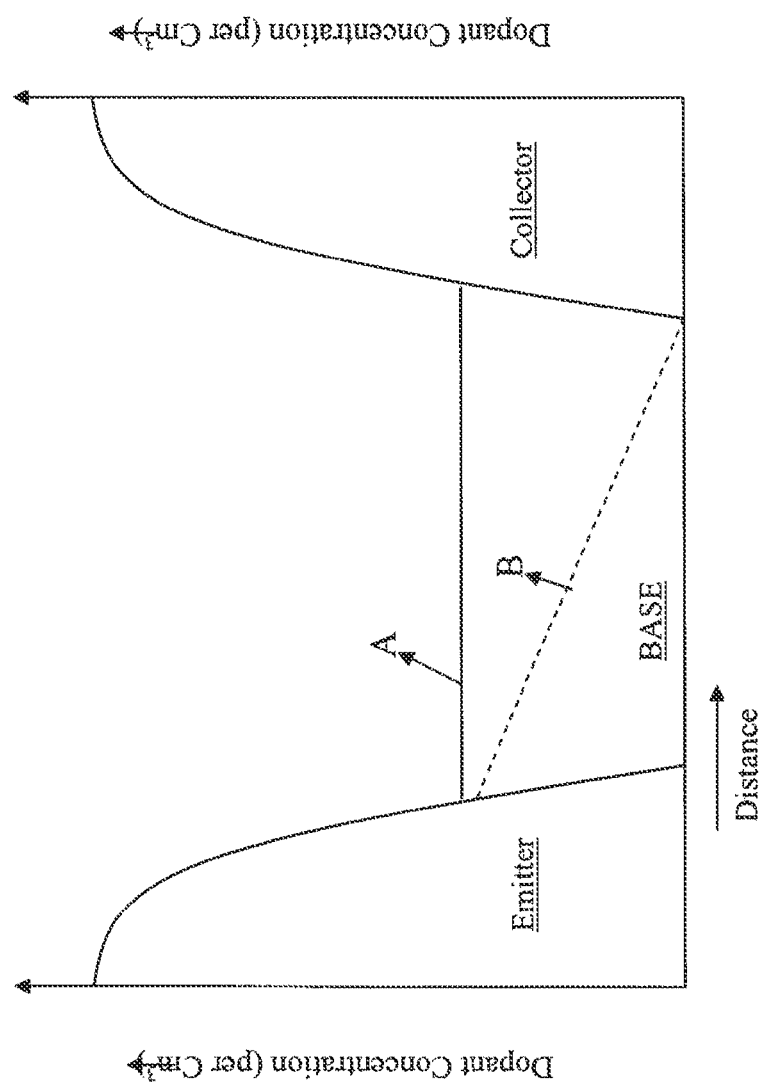
FIG. 1 illustrates the relative doping profiles of emitter, base and collector for the two most popular bipolar junction transistors: namely, uniform base ("A") and graded base ("B")
Figure 2:
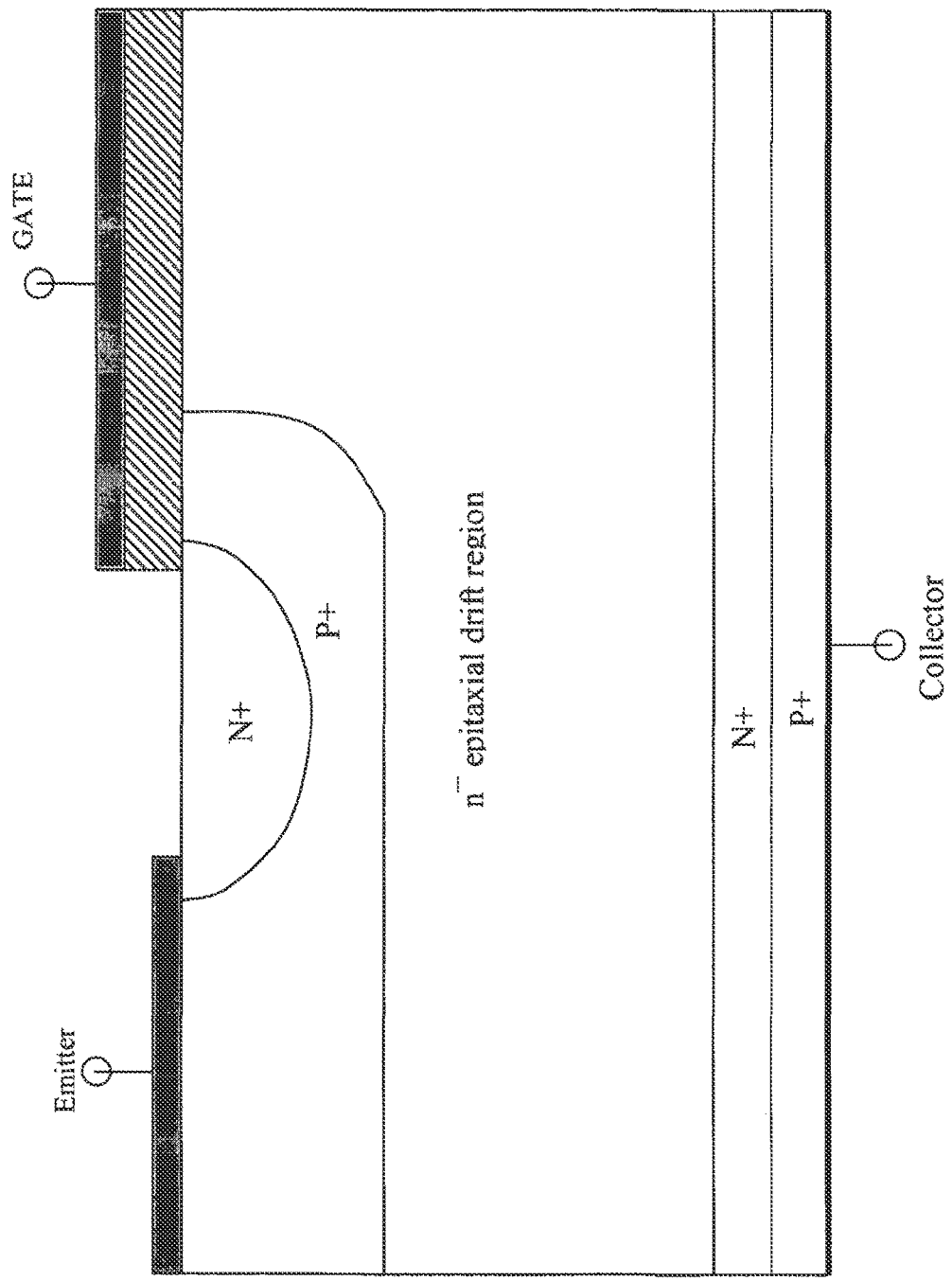
FIG. 2 illustrates the cross section of a commercial IGBT with a uniform epitaxial drift region (base)
Figure 3A:
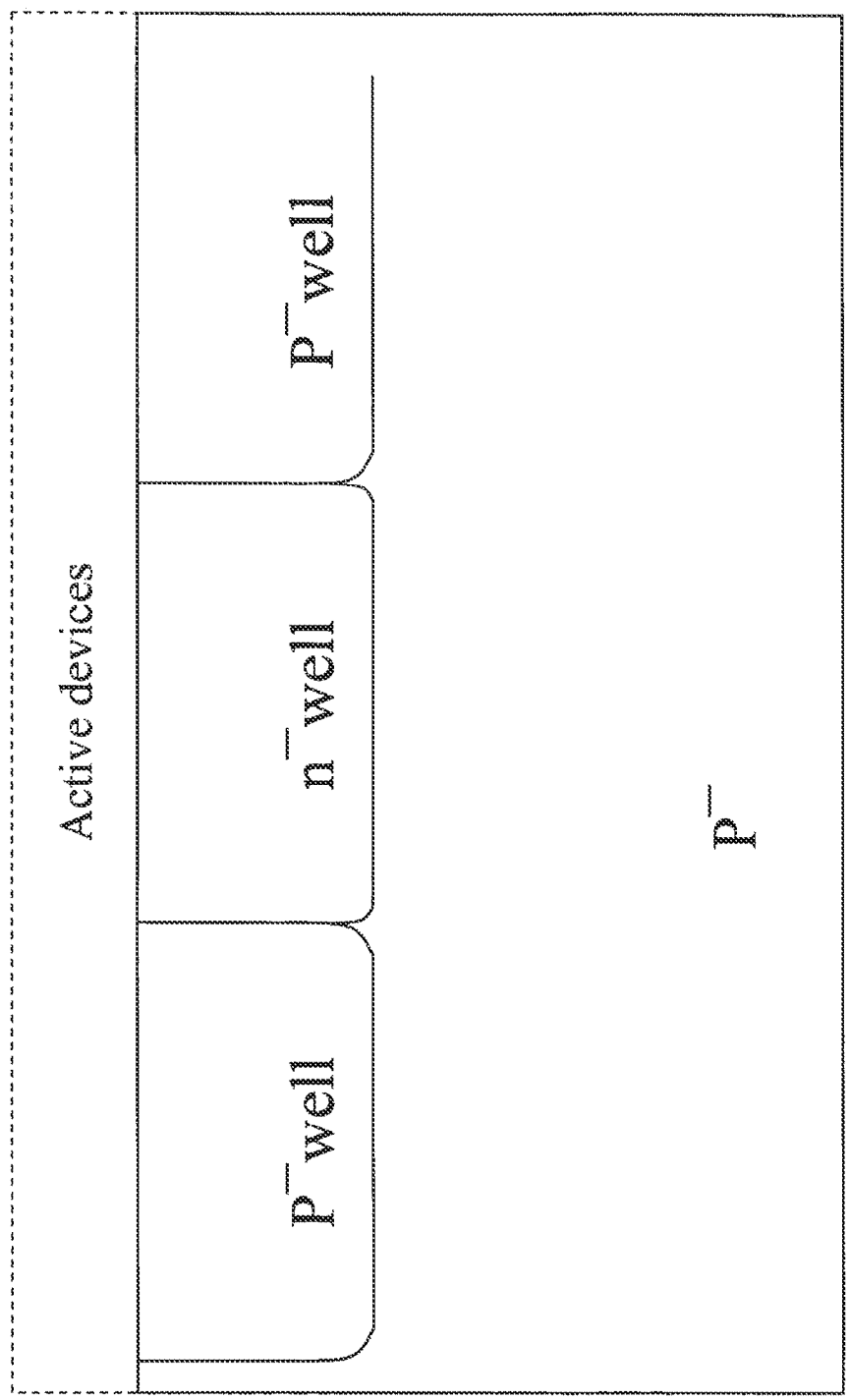
FIGS. 3A, 3B, 3C, and 3D illustrate cross sections of commonly used prior art CMOS silicon substrates.
Figure 3B:
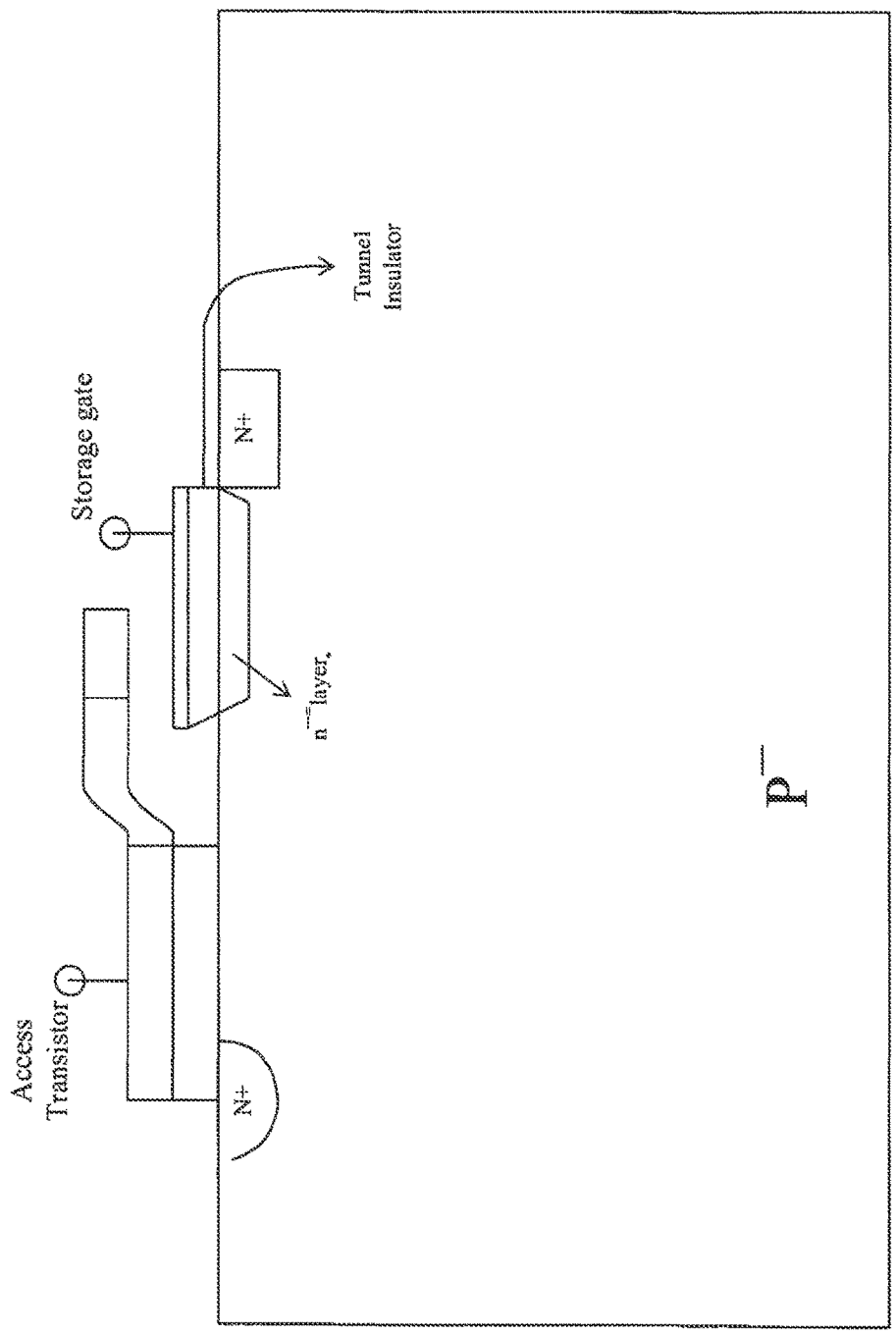
Figure 3C:
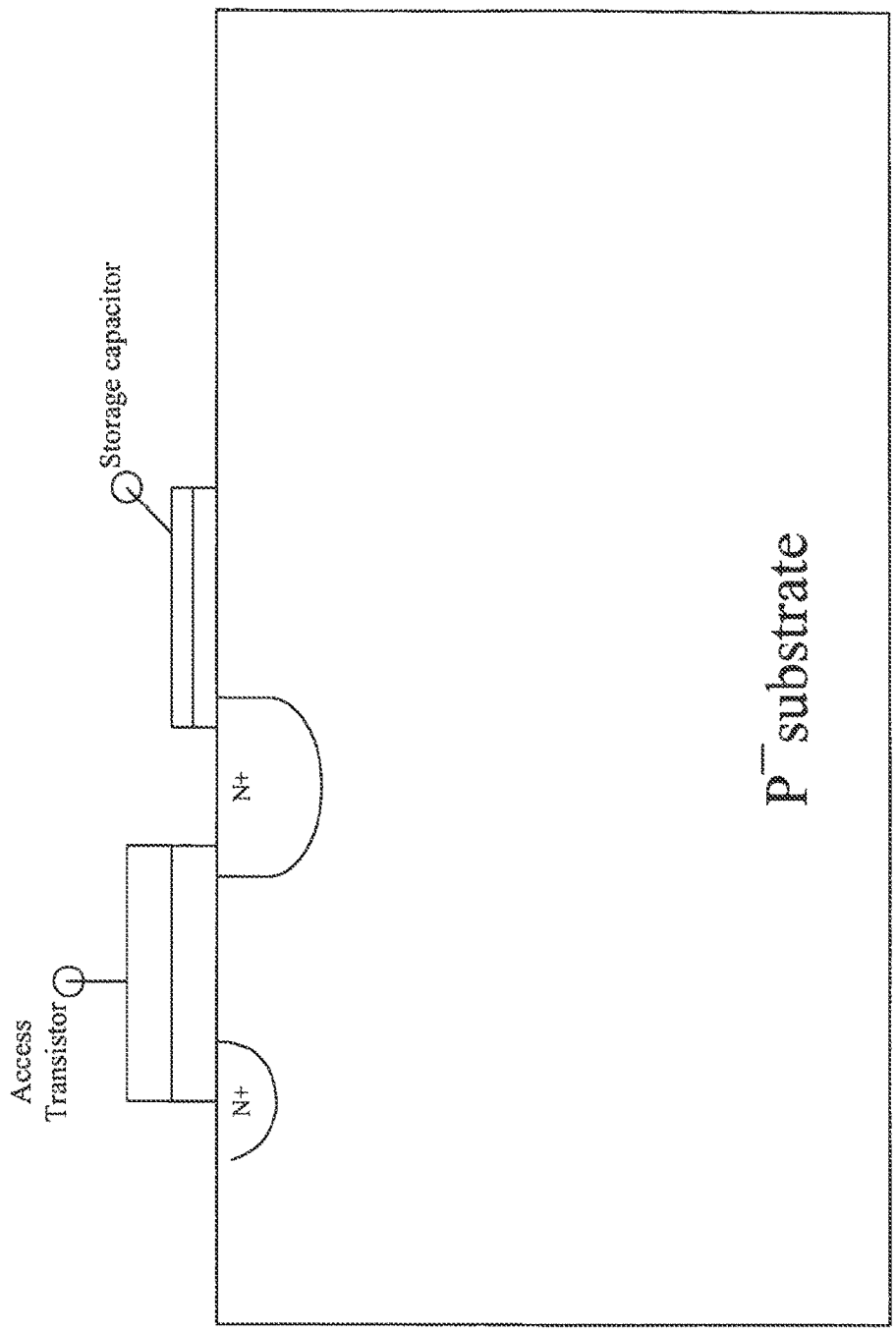
Figure 3D:
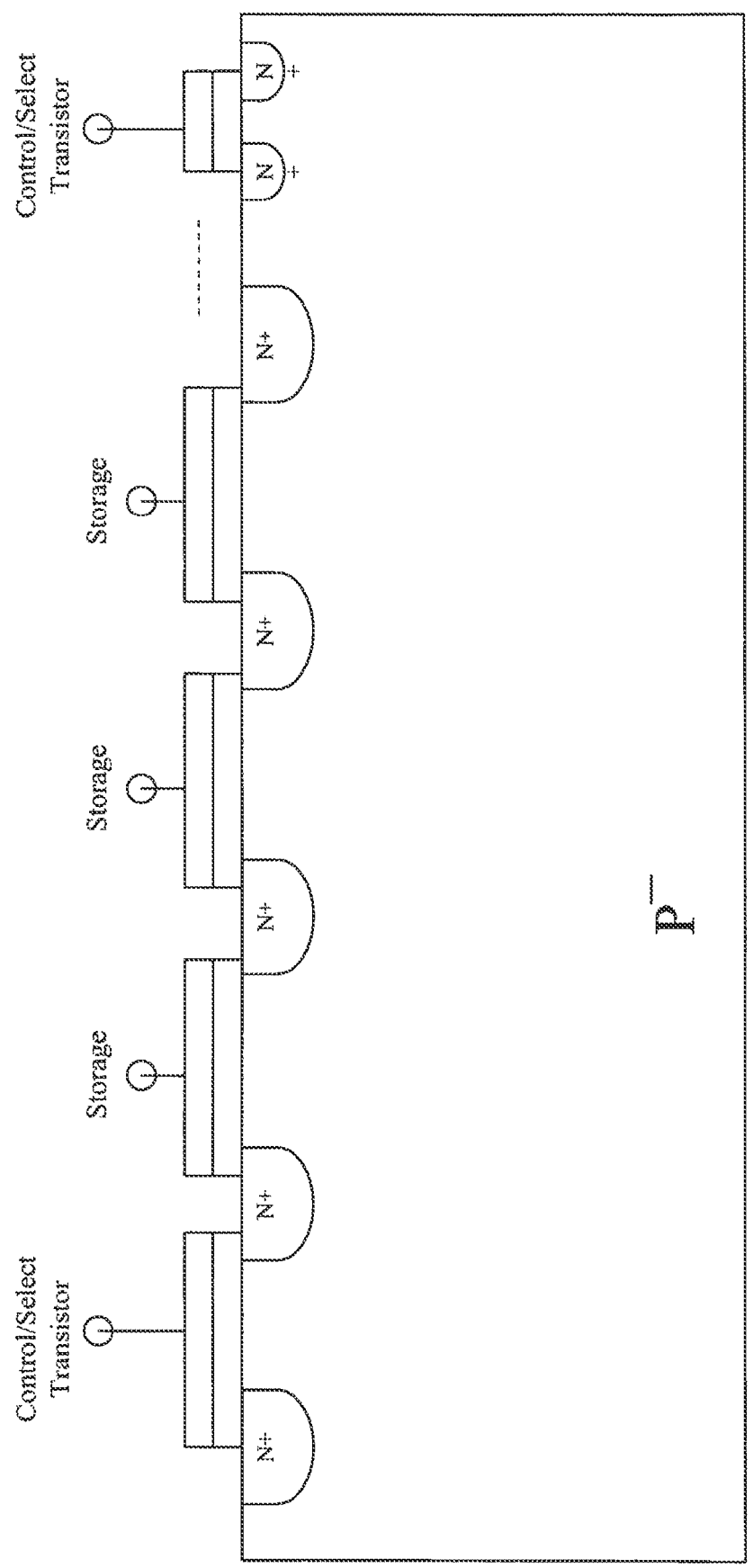
Figure 4:
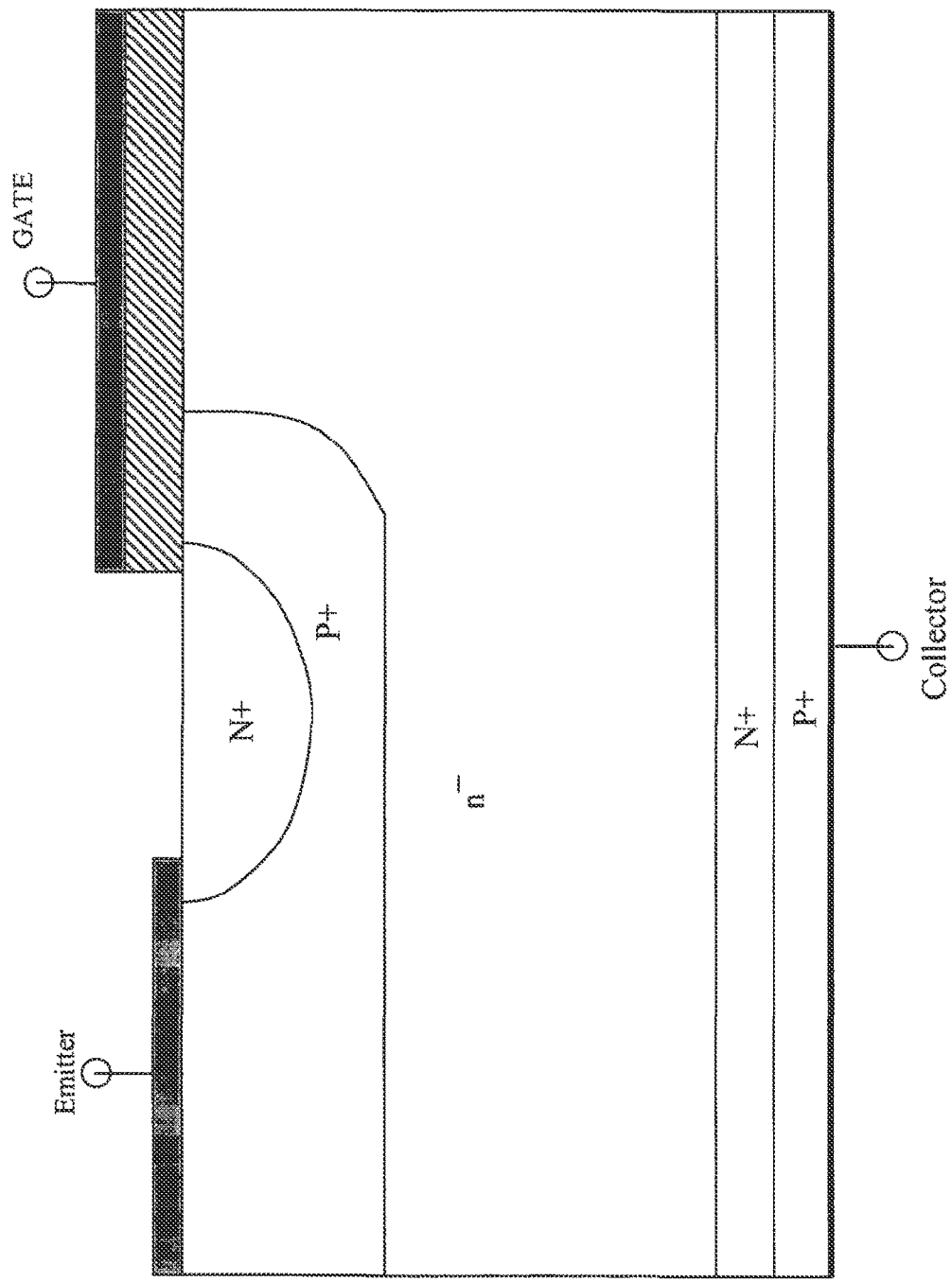
FIG. 4 illustrates the cross section of an IGBT, using one embodiment of the invention described here, where the dopant is optimally graded in the epitaxial drift region.

As illustrated in FIG. 4, in one embodiment according to the invention, a donor gradient is established from the emitter-drift epitaxial base region junction of the punch-through IGBT, to the drift epitaxial base region—$n^+$ buffer layer boundary (electrons in this case are accelerated in their transit from emitter to collector). The "average" base resistance is optimized so that conductivity modulation and lifetime (for minority carriers) in the base region are not compromised. By sweeping the carriers towards the $n^+$ buffer region a number of advantages are obtained. First, the frequency of operation (combination of $t_{on}$ and $t_{off}$ as is known in the IGBT commercial nomenclature) can be enhanced. Second, and maybe more importantly, during $t_{off}$, holes can be recombined much quicker at the $n^+$ buffer layer, compared to the uniformly doped $n^-$ epitaxial drift region by establishing a different dopant gradient near the $n^+$ buffer layer. It should be noted that the drift region can also be a non-epitaxial silicon substrate. Although epitaxy enhances lifetime, it is not mandatory. Different layers of dopant regions can be transferred through wafer to wafer bonding (or other similar transfer mechanisms) for eventual device fabrication. The "reverse recovery time" for an IGBT is significantly improved due to the optimized graded dopant in the so called "drift region" as well as at the interfaces of the drift region. Graded dopants can also be implemented in the $n^+$ buffer layer as well as other regions adjacent to the respective layers. Two important performance enhancements are the result of dopant gradients. For example, in an n-channel IGBT, electrons can be swept from source to drain rapidly, while at the same time holes can be recombined closer to the $n^+$ buffer layer. This can improve $t_{on}$ and $t_{off}$ in the same device.

Figure 5A:
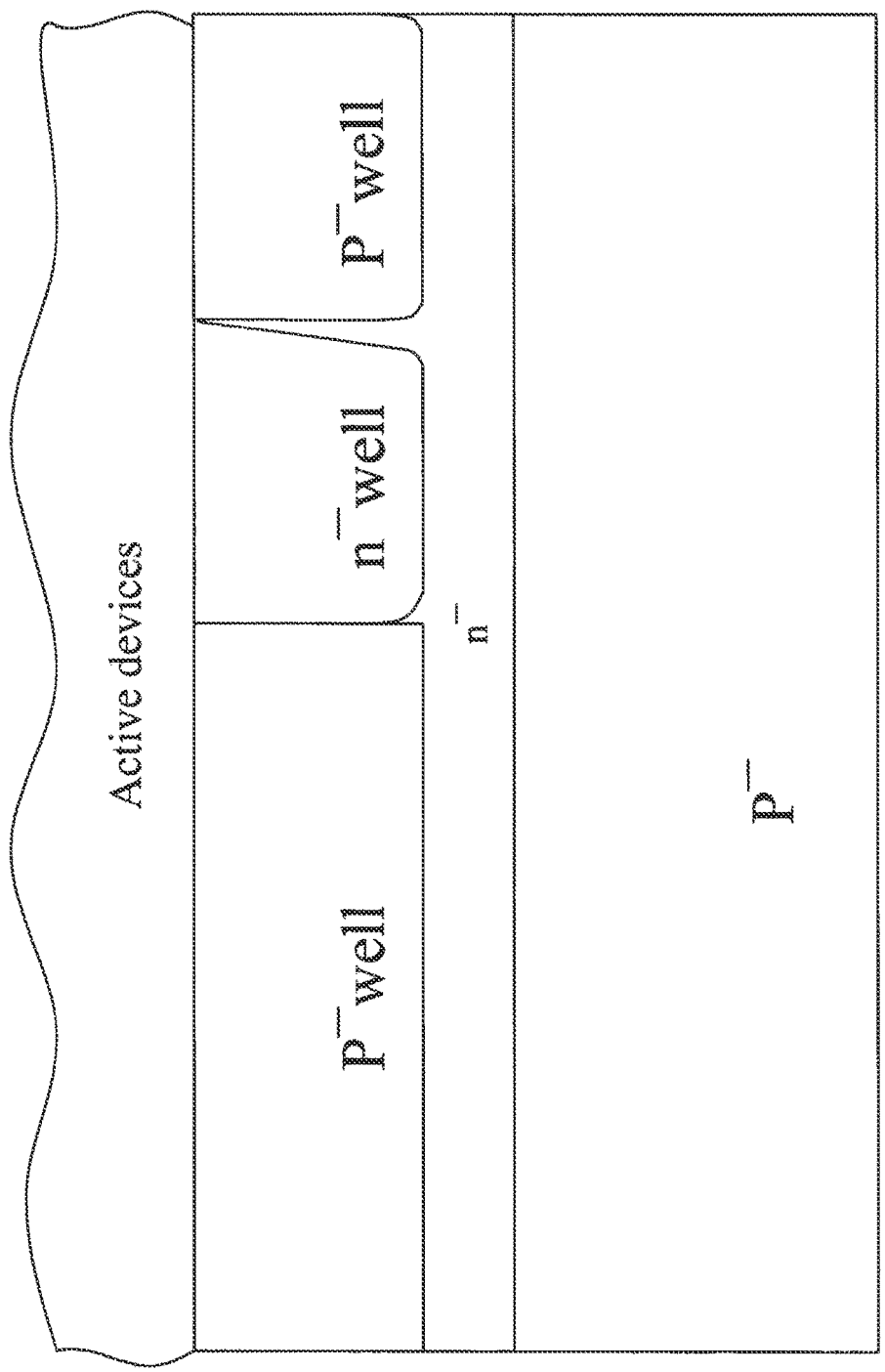
FIGS. 5A, 5B, and 5C illustrate the cross sections of a CMOS silicon substrate with two wells and an underlying layer using embodiments of the invention to improve performance in each application—VLSI logic, DRAM/image IC, nonvolatile memory IC.
Figure 5B:
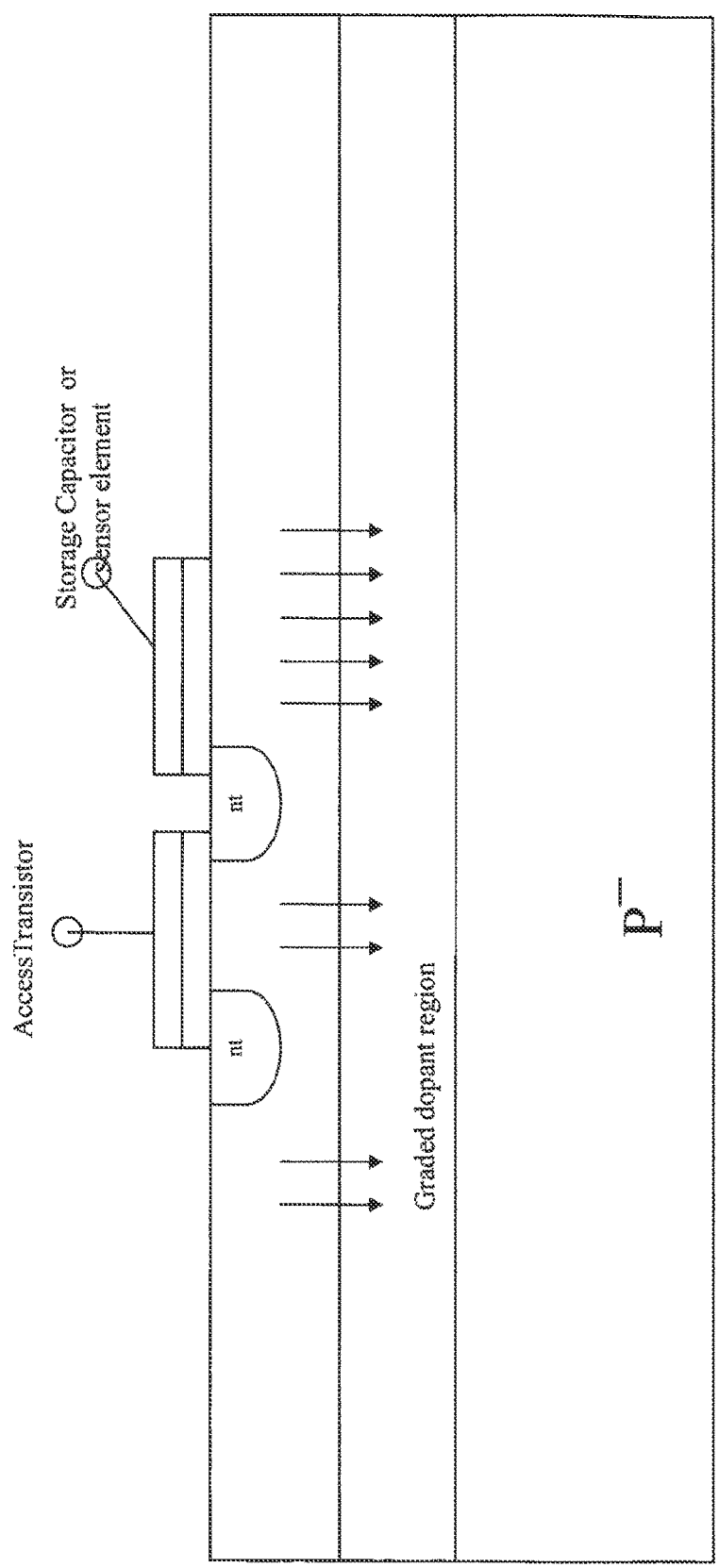
Figure 5C:
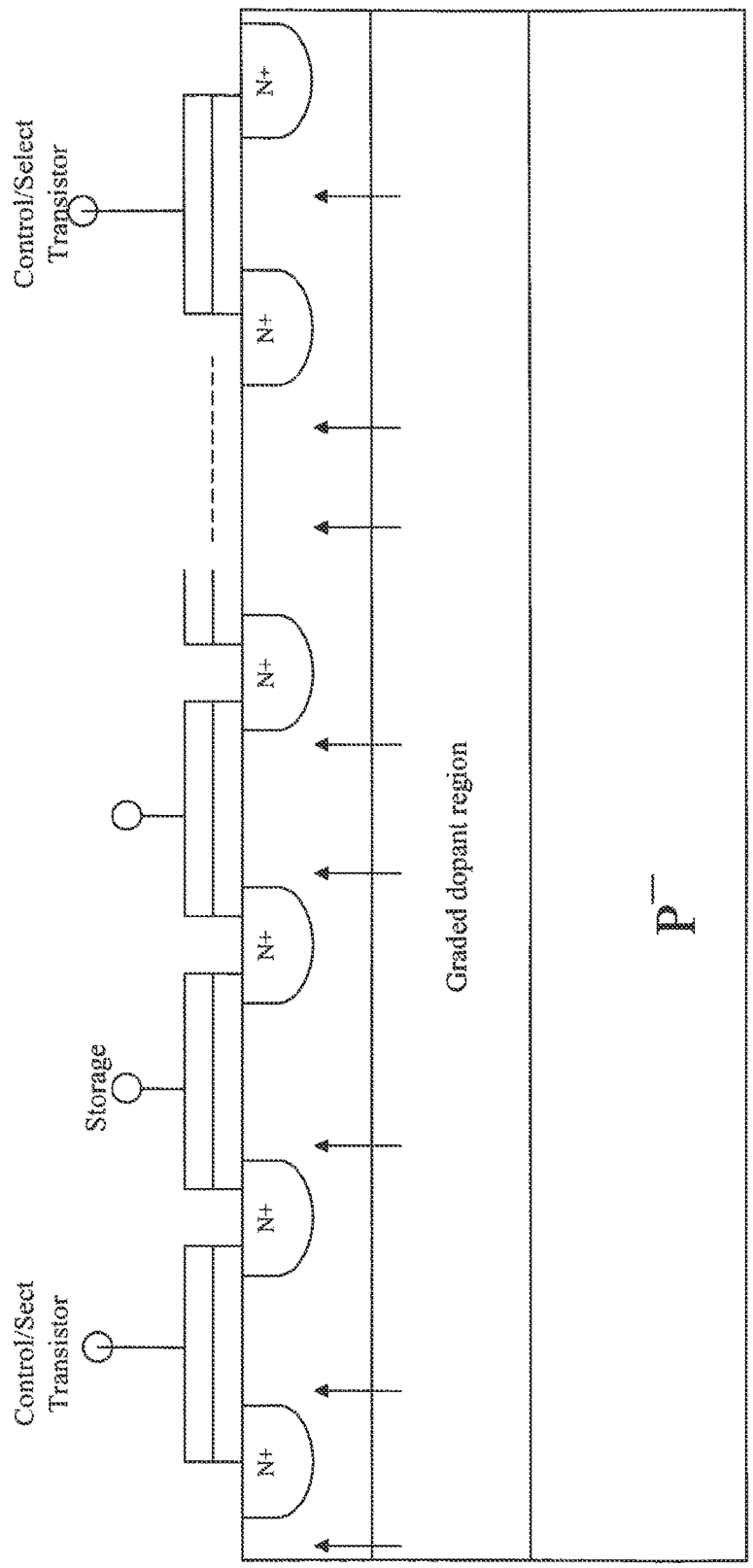

As illustrated in FIGS. 5A, 5B, and 5C, donor gradient is also of benefit to very large scale integrated circuits (VLSI)—VLSI logic, DRAM, nonvolatile memory like NAND flash. Spurious minority carriers can be generated by clock switching in digital VLSI logic and memory ICs. These unwanted carriers can discharge dynamically-held "actively held high" nodes. In most cases, statically-held nodes (with $V_{cc}$) cannot be affected. Degradation of refresh time in DRAMs is one of the results, because the capacitor holds charge dynamically. Similarly, degradation of CMOS digital images in digital imaging ICs is another result of the havoc caused by minority carriers. Pixel and color resolution can be significantly enhanced in imaging ICs with the embodiments described herein. Creating "subterranean" recombination centers underneath the wells (gold doping, platinum doping) as is done in some high-voltage diodes is not practical for VLSI circuits. Hence, a novel technique is described herein which creates a drift field to sweep these unwanted minority carriers from the active circuitry at the surface into the substrate in a monolithic die as quickly as possible. In a preferred embodiment, the subterranean $n^-$ layer has a graded donor concentration to sweep the minority carriers deep into the substrate. One or more of such layers can also be implemented through wafer to wafer bonding or similar "transfer" mechanisms. This $n^-$ layer can be a deeply-implanted layer. It can also be an epitaxial layer. As desired, the $n^-$ well and $p^-$ wells can also be graded or retrograded in dopants to sweep those carriers away from the surface as well. The graded dopant can also be implemented in surface channel MOS devices to accelerate majority carriers towards the drain. To decrease programming time in nonvolatile memory devices, carriers should be accelerated towards the surface when programming of memory cells is executed. The graded dopant can also be used to fabricate superior Junction Field-Effect transistors where the "channel pinch-off" is controlled by a graded channel instead of a uniformly doped channel (as practiced in the prior art).

One of ordinary skill and familiarity in the art will recognize that the concepts taught herein can be customized and tailored to a particular application in many advantageous ways. For instance, minority carriers can be channeled to the surface to aid programming in nonvolatile memory devices (NOR, NAND, multivalued-cell). Moreover, single-well, and triple-well CMOS fabrication techniques can also be optimized to incorporate these embodiments individually and collectively. Any modifications of such embodiments (described here) fall within the spirit and scope of the invention. Hence, they fall within the scope of the claims described below.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. An electronic system, the system comprising:
   at least one semiconductor device, the at least one semiconductor device including:
   a substrate of a first doping type at a first doping level having a surface;
   a first active region disposed adjacent the surface with a second doping type opposite in conductivity to the first doping type and within which transistors can be formed;
   a second active region separate from the first active region disposed adjacent to the first active region and within which transistors can be formed;
   transistors formed in at least one of the first active region or second active region;
   at least a portion of at least one of the first and second active regions having at least one graded dopant concentration to aid carrier movement from the first and second active regions towards an area of the substrate where there are no active regions; and at least one well region adjacent to the first or second active region containing at least one graded dopant region, the graded dopant region to aid carrier movement from the surface towards the area of the substrate where there are no active regions, wherein at least some of the transistors form digital logic of the semiconductor device.

2. The system of claim 1, wherein the substrate of the at least one semiconductor device is a p-type substrate.

3. The system of claim 1, wherein the substrate of the at least one semiconductor device has epitaxial silicon on top of a nonepitaxial substrate.

4. The system of claim 1, wherein the first active region and second active region of the at least one semiconductor device contain digital logic formed by one of either p-channel and n-channel devices.

5. The system of claim 1, wherein the first active region and second active region of the at least one semiconductor device contain either p-channel or n-channel devices in n-wells or p-wells, respectively, and each well has at least one graded dopant.

6. The system of claim 1, wherein the first active region and second active region of the at least one semiconductor device are each separated by at least one isolation region.

7. The system of claim 1, wherein the graded dopant is fabricated with an ion implantation process.

8. The system of claim 1, wherein the first and second active regions of the at least one semiconductor device are formed adjacent the first surface of the substrate of the at least one semiconductor device.

9. The system of claim 1, wherein dopants of the graded dopant concentration in the first active region or the second active region of the at least one semiconductor device are either p-type or n-type.

10. The system of claim 1, wherein dopants of the graded dopant concentration in the first active region of the at least one semiconductor device are both p-type and n-type.

11. The system of claim 1, wherein dopants of the graded dopant concentration in the second active region of the at least one semiconductor device are both p-type and n-type.

12. The system of claim 1, wherein dopants of the graded dopant region in the well region of the at least one semiconductor device are both p-type and n-type.

13. The system of claim 1, wherein the transistors which can be formed in the first and second active regions of the at least one semiconductor device are CMOS digital logic transistors requiring at least a source, a drain, a gate and a channel.

14. The system of claim 1, wherein the at least one semiconductor device is a dynamic random access memory (DRAM).

15. The system of claim 1, wherein the at least one semiconductor device is a complementary metal oxide semiconductor (CMOS) with a nonepitaxial substrate.

16. The system of claim 1, wherein the at least one semiconductor device is a flash memory.

17. The system of claim 1, wherein the at least one semiconductor device comprises digital logic and capacitors.

18. The system of claim 1, wherein the at least one semiconductor device is a central processing unit.

19. The system of claim 1, wherein the at least one semiconductor device is an image sensor.

20. The system of claim 1, wherein each of the first and second active regions of the at least one semiconductor device are in the lateral or vertical direction.

21. An electronic system, comprising:
at least one semiconductor device, the at least one semiconductor device including:
a substrate of a first doping type at a first doping level having a surface;
a first active region disposed adjacent the surface of the substrate with a second doping type opposite in conductivity to the first doping type and within which transistors can be formed in the surface thereof;
a second active region separate from the first active region disposed adjacent to the first active region and within which transistors can be formed in the surface thereof;
transistors formed in at least one of the first active region or second active region;
at least a portion of at least one of the first and second active regions having at least one graded dopant concentration to aid carrier movement from the surface to an area of the substrate where there are no active regions; and
at least one well region adjacent to the first or second active region containing at least one graded dopant region, the graded dopant region to aid carrier movement from the surface to the area of the substrate where there are no active regions, and wherein the graded dopant concentration is linear, quasilinear, error function, complementary error function, or any combination thereof.

22. The system of claim 21, wherein the substrate of the at least one semiconductor device is an n-type substrate.

23. The system of claim 21, wherein the substrate of the at least one semiconductor device is a p-type substrate.

24. The system of claim 21, wherein the substrate of the at least one semiconductor device has epitaxial silicon on top of a nonepitaxial substrate.

25. The system of claim 21, wherein the first active region and second active region of the at least one semiconductor device contain at least one of either p-channel and n-channel devices.

26. The system of claim 21, wherein the first active region and second active region of the at least one semiconductor device contain either p-channel or n-channel devices in n-wells or p-wells, respectively, and each well has at least one graded dopant.

27. The system of claim 21, wherein the first active region and second active region of the at least one semiconductor device are each separated by at least one isolation region.

28. The system of claim 21, wherein dopants of the graded dopant concentration in the first active region or the second active region of the at least one semiconductor device are either p-type or n-type.

29. The system of claim 21, wherein dopants of the graded dopant concentration in the first active region of the at least one semiconductor device are both p-type and n-type.

30. The system of claim 21, wherein dopants of the graded dopant concentration in the second active region of the at least one semiconductor device are both p-type and n-type.

\* \* \* \* \*